(12) United States Patent
Schenk

(10) Patent No.: US 9,236,190 B2
(45) Date of Patent: Jan. 12, 2016

(54) CAPACITOR CIRCUIT FOR A QUASI-BROADBAND DOHERTY AMPLIFIER

(71) Applicant: Rohde & Schwarz GmbH & Co. KG, Munich (DE)

(72) Inventor: Lothar Schenk, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/716,638

(22) Filed: May 19, 2015

(65) Prior Publication Data
US 2015/0255219 A1 Sep. 10, 2015

Related U.S. Application Data

(62) Division of application No. 14/115,061, filed as application No. PCT/EP2012/056989 on Apr. 17, 2012.

(30) Foreign Application Priority Data

May 5, 2011 (DE) .......................... 10 2011 075 312

(51) Int. Cl.
*H01G 5/00* (2006.01)
*H01G 7/00* (2006.01)
*H01G 5/16* (2006.01)

(52) U.S. Cl.
CPC ...................................... *H01G 5/16* (2013.01)

(58) Field of Classification Search
USPC ........... 361/272–280, 290–291, 283.1, 283.2, 361/283.4
See application file for complete search history.

(56) References Cited

U.S. PATENT DOCUMENTS

| | | | |
|---|---|---|---|
| 7,773,959 B1 | 8/2010 | Bachhuber | |
| 2007/0008032 A1 | 1/2007 | Kyu | |
| 2007/0070576 A1 | 3/2007 | Lynch | |
| 2007/0242410 A1* | 10/2007 | Leeper | H01G 7/06 361/277 |
| 2009/0102553 A1 | 4/2009 | Yang | |
| 2009/0146765 A1 | 6/2009 | Chen | |
| 2011/0169590 A1 | 7/2011 | Namerikawa | |

FOREIGN PATENT DOCUMENTS

| | | |
|---|---|---|
| EP | 0 637 042 A2 | 2/1995 |
| EP | 1 609 239 B1 | 12/2005 |

(Continued)

OTHER PUBLICATIONS

Djoumessi, E.E., et al., "Varactor-Tuned Dual-Band Quadrature Hybrid Coupler," IEEE Microwave and Wireless Components Letters 16(11):603-605, Nov. 2006.

(Continued)

*Primary Examiner* — Hieu Nguyen
(74) *Attorney, Agent, or Firm* — Christensen O'Connor Johnson Kindness PLLC

(57) ABSTRACT

An amplifier provides a first amplifier circuit, a second amplifier circuit, a first hybrid-coupler circuit and a termination. The hybrid-coupler circuit provides an output terminal and an insulation terminal. In this context, the termination is connected to the insulation terminal of the hybrid-coupler circuit. The termination comprises a first capacitor and/or an inductance, which is disposed directly at the insulation terminal of the hybrid-coupler circuit.

8 Claims, 12 Drawing Sheets

(56) References Cited

FOREIGN PATENT DOCUMENTS

| | | |
|---|---|---|
| GB | 1 520 949 A | 8/1978 |
| WO | 2011048893 A1 | 4/2011 |

OTHER PUBLICATIONS

Fardin, E.A., et al., "A Varactor Tuned Branch-Line Hybrid Coupler," Proceedings of the Asia-Pacific Microwave Conference (APMC 2005), Dec. 4-7, 2005, Suzhou, China, 4 pages.

Ferrero, F., et al., "Compact Quasi-Lumped Hybrid Coupler Tunable Over Large Frequency Band," Electronics Letters 43(19):1030-1031, Sep. 2007.

Nishino, T., et al., "Tunable MEMS Hybrid Coupler and L-Band Tunable Filter," IEEE MTT-S International Microwave Symposium Digest (MTT 2009), Jun. 7-12, 2009, Boston, pp. 1045-1048.

International Search Report mailed Aug. 9, 2012, issued in corresponding International Application No. PCT/EP2012/056989, filed Jul. 17, 2012, 5 pages.

International Preliminary Report on Patentability mailed Nov. 5, 2013, issued in corresponding International Application No. PCT/EP2012/056989, filed Jul. 17, 2012, 10 pages.

\* cited by examiner

US 9,236,190 B2

CAPACITOR CIRCUIT FOR A QUASI-BROADBAND DOHERTY AMPLIFIER

CROSS-REFERENCES TO RELATED APPLICATIONS

This application is a division of U.S. patent application Ser. No. 14/115,061, filed Oct. 31, 2013, which is the National Stage of International Application No. PCT/EP2012/056989, filed Apr. 17, 2012, all the disclosures of which are incorporated by reference herein.

BACKGROUND

Doherty amplifiers are used conventionally to set up high-frequency amplifiers with high efficiency and high linearity.

A Doherty amplifier which uses a 3 dB coupler simultaneously as an impedance transformer for the main amplifier and as a power combiner for the main and auxiliary amplifier by terminating the de-coupled terminal of the 3 dB coupler, which is normally terminated with the system wave impedance, with a short-circuit or open-circuit line of a given length, is known from European Patent EP 1 609 239 B1. The arrangement shown in that context has the disadvantage that a frequency variation beyond the conventional Doherty bandwidth is not possible, and the space requirement for a low-loss line is relatively large.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Aspects of the present invention are based upon the object of providing, among other things, a capacitor circuit suitable for use with a high-frequency amplifier. In one or more embodiments, the capacitor circuit provides for a reduced space requirement which provides high efficiency and high linearity.

This object and others is achieved according to one or more aspects of the present invention as set forth by the capacitor circuit of independent Claim 1. Advantageous further developments form the subject matter of the dependent claims relating back to these claims.

One representative embodiment of an amplifier suitable for employing the capacitor circuit of Claim 1 includes a first amplifier circuit, a second amplifier circuit, and a first hybrid-coupler circuit. The hybrid-coupler circuit provides an output terminal and an insulation terminal. In this context, a termination is connected to the insulation terminal of the hybrid-coupler circuit. The termination comprises a capacitor circuit, such as the capacitor circuit of Claim 1. In one embodiment the termination is arranged directly at the insulation terminal of the hybrid-coupler circuit. In this manner, a high efficiency and great flexibility of use is achieved.

One or more aspects of the present invention is based upon the insight that the electrical properties of a short-circuited or open line of a given length can be modelled by discrete elements. Instead of the relatively space-intensive line structure, a capacitor or an inductance can be used. Instead of generating the wave impedance required for the termination by a short circuit or open circuit, which is transformed by a line to the insulation terminal, the necessary wave impedance is generated according to an aspect of the present invention directly at the insulation terminal by a discrete capacitor and/or a discrete inductance. The space requirement for the circuit can be dramatically reduced in this manner.

In some embodiments, the capacitor or the inductance is adjustable. The frequency range of the amplifier can accordingly be adjusted in a simple manner.

In some embodiments, a quasi-broadband system can be achieved if the adjustment is implemented automatically, that is, for example, by a servo motor. In systems in which changes in frequency are only rarely necessary and the amplifier operates simultaneously only in one frequency range, the amplifier can therefore be used within a very broad frequency range.

In some embodiments, it is additionally possible to switch between the capacitor or the inductance and a termination by a 50 ohm resistance. In this manner, it is possible to switch between a broadband amplifier of conventional design with relatively poor efficiency and a tuneable Doherty amplifier with relatively good efficiency.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

Initially, the structure and method of functioning of an amplifier according to one or more aspects of the present invention will be explained with reference to FIGS. 1-7. Following this, the structure and method of functioning of various forms of a capacitor circuit according to one or more aspects of the present invention will be explained with reference to FIGS. 8-15. The presentation and description of identical elements in similar drawings will not be repeated in some cases.

Figure 1:
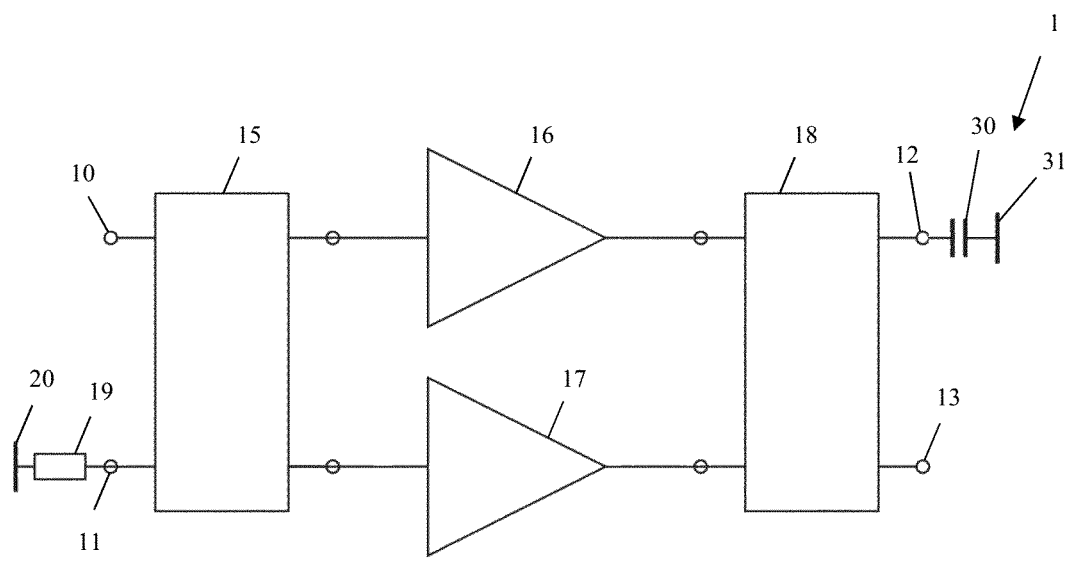
FIG. 1 is a first exemplary embodiment of the amplifier according to an aspect of the present invention.

FIG. 1 shows a first exemplary embodiment of an amplifier according to an aspect of the present invention. A power splitter 15 provides two input terminals 10 and 11. An input signal can be fed in at the first input terminal 10. The second input terminal 11 is connected to a resistor 19 and a ground connection 20. Furthermore, a first amplifier circuit 16 and a second amplifier circuit 17 are connected to the power splitter 15. These form the main amplifier and the auxiliary amplifier according to the Doherty principle. Outputs from these amplifier circuits 16, 17 are connected to a hybrid-coupler circuit 18. An insulation terminal 12 of this hybrid-coupler circuit 18 is terminated with a discrete capacitor 30 and a ground connection 31. The capacitor 30 and the ground connection 31 therefore form a termination 1.

The signal to be amplified is supplied to the input terminal 10 of the power splitter 15. The latter splits the signal between the two amplifier circuits 16, 17, which amplify the signal according to the Doherty principle. The amplified signals are combined by the hybrid-coupler circuit 18 at its output terminal 13. An optimum termination of the hybrid-coupler circuit 18 with a given frequency is achieved by the capacitor 30 and the ground connection 31 at the insulation terminal 12 of the hybrid-coupler circuit 18. At the same time, a very small structural space is required.

A further advantageous embodiment is to exchange the first amplifier circuit 16 and the second amplifier circuit 17 in the circuit. A Doherty amplifier which operates in an inverse manner at a different frequency is obtained in this manner. The useful bandwidth of the system is doubled if the operating-point control can change the configuration. However, a coherent frequency range is not necessarily obtained.

Figure 2:
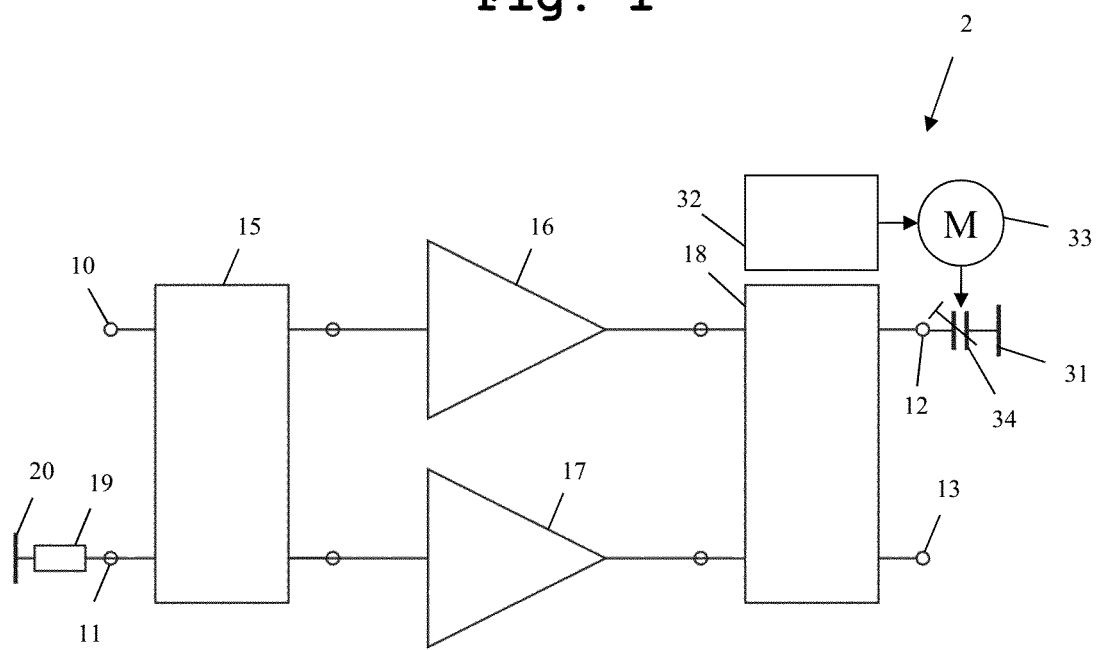
FIG. 2 is a second exemplary embodiment of the amplifier according to an aspect of the present invention.

FIG. 2 shows a second exemplary embodiment of an amplifier according to an aspect of the present invention. The circuit corresponds largely to the circuit from FIG. 1. The discrete capacitor 30 with fixed capacitance from FIG. 1 is replaced here with an adjustable capacitor 34. The capacitance of this capacitor 34 can be adjusted by a servo motor 33 which is controlled by the control device 32. The capacitor 34, the ground connection 31, the servo motor 33 and the control device 32 thus form a termination 2.

In this manner, it is possible to adjust the frequency for which the hybrid-coupler circuit 18 is optimally terminated. Since the amplifier operates simultaneously only on one frequency, it is unproblematic that the adjustment of the adjustable capacitor 34 by the servo motor 33 requires a certain time.

Figure 3:
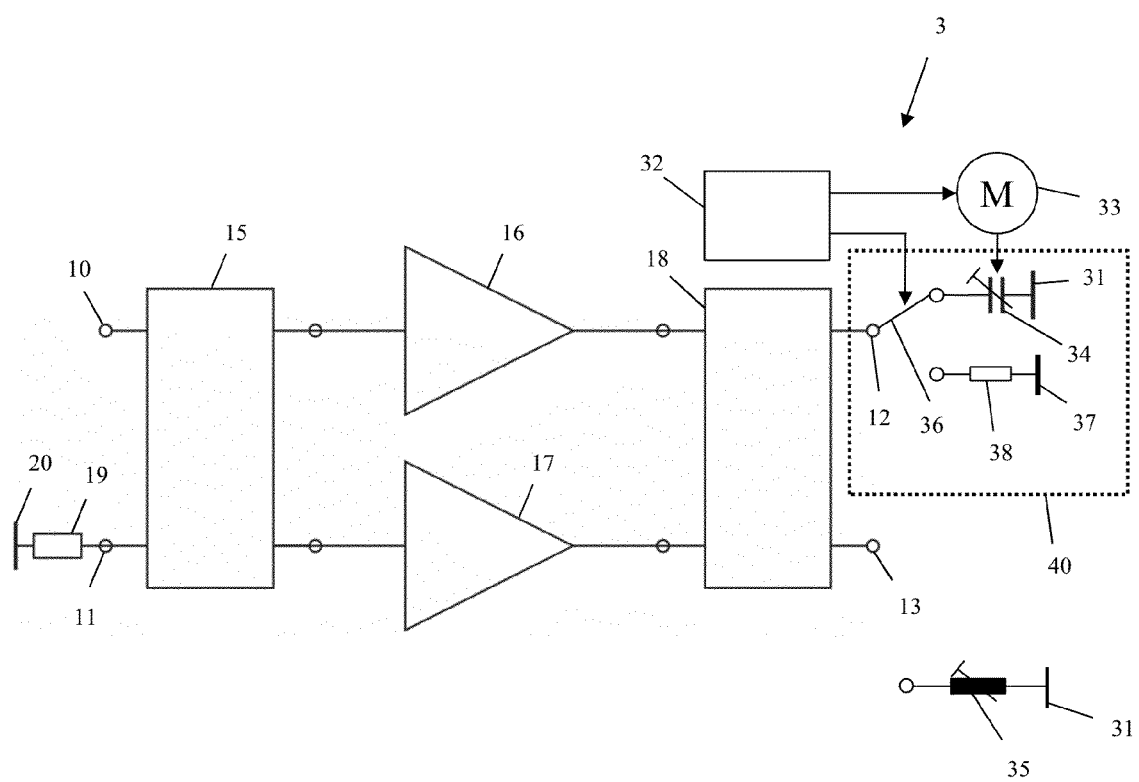
FIG. 3 is a third exemplary embodiment of the amplifier according to an aspect of the present invention.

FIG. 3 shows a third exemplary embodiment of an amplifier according to an aspect of the present invention. This drawing also corresponds largely to the drawing from FIG. 1. Additionally, in this case, the output terminal 12 of the hybrid-coupler circuit 18 is connected to a switch 36. The switch 36 switches between the adjustable capacitor 34 from FIG. 2 and an ohmic terminating resistor 38 in series with a ground connection 37. The capacitor 34, the ground connection 31, the servo motor 33, the control device 32, the switch 36, the ohmic resistor 38 and the ground connection 37 therefore form a termination 3.

This creates a possibility for switching between an operation as a Doherty amplifier and an operation as a conventional broadband amplifier. In addition to the switching by means of the switch 36, the operating points of the amplifier circuits 16 and 17 must also be matched. In this context, the switch 36 is additionally controlled by the control device 32 from FIG. 2. Accordingly, a manual intervention is not required.

The combination of the switch 36, the adjustable capacitor 34 and the alternatively connected ohmic resistor 38 thus forms a capacitor circuit 40. The following drawings show a possible embodiment of such a capacitor circuit. As an alternative, the adjustable capacitor 34 can also be replaced by an adjustable inductance 35, as illustrated below.

Alternatively, instead of the motor 33 and the adjustable capacitor 34, a switch 36 with several capacitors of fixed capacitance can also be used. In this case, the switching is implemented between the ohmic resistor 38 and several fixed capacitances. It is also conceivable to dispense with the switch 36 and the control device 32. In this case, the terminal 12 is connected to the ohmic resistor 38 or a capacitor via a solder bridge.

Figure 4:
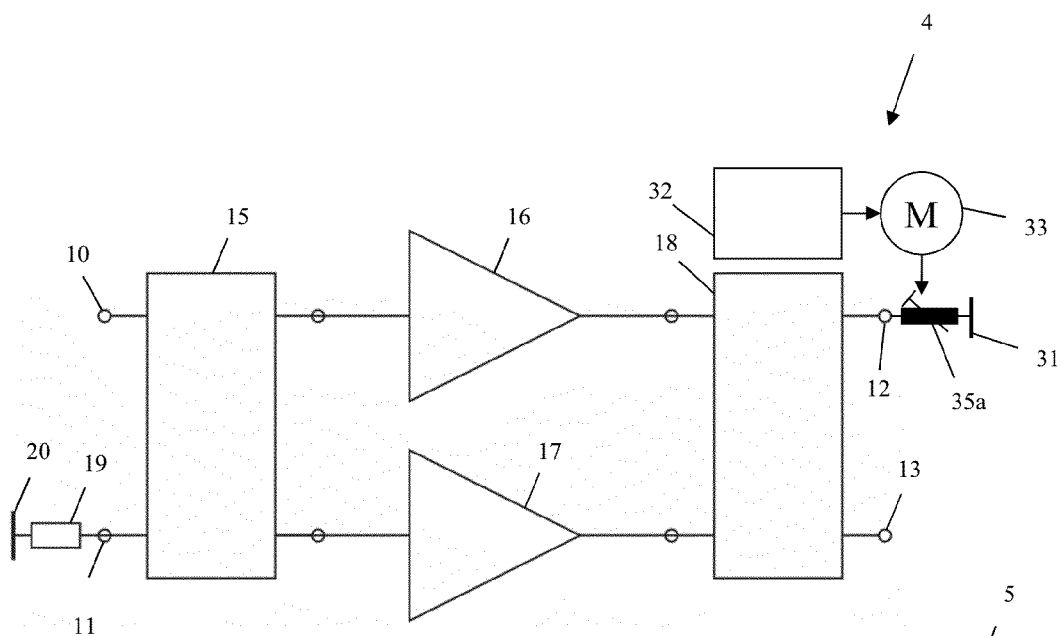
FIG. 4 is a fourth exemplary embodiment of the amplifier according to an aspect of the present invention.

FIG. 4 shows a fourth exemplary embodiment of an amplifier according to an aspect of the present invention. This amplifier corresponds largely to the amplifier from FIG. 2. However, in this case, the adjustable capacitor 24 has been replaced with an adjustable inductance 35a.

Figure 5:
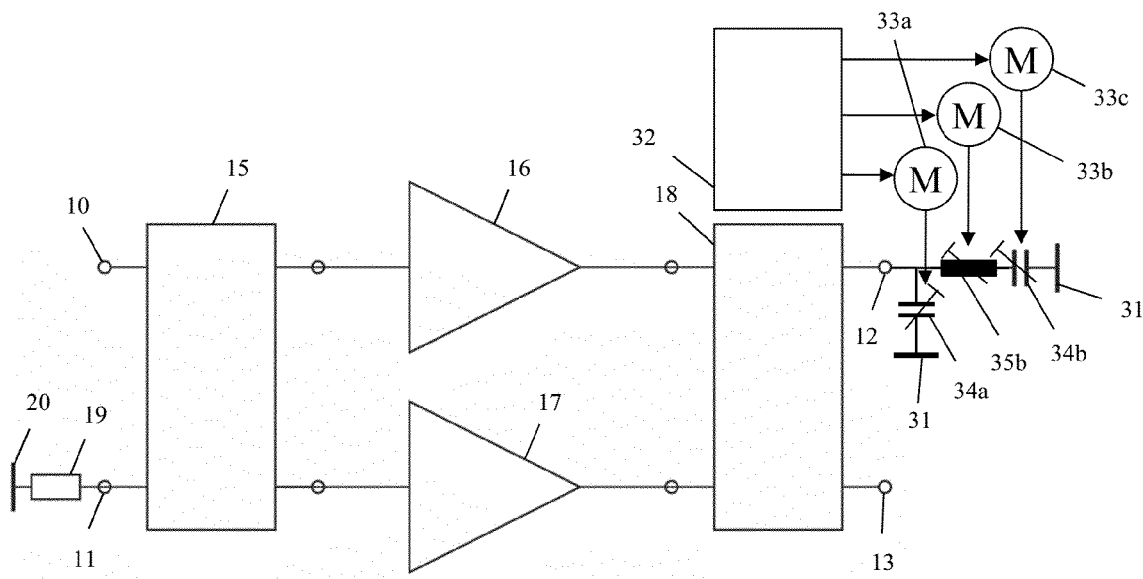
FIG. 5 is a fifth exemplary embodiment of the amplifier according to an aspect of the present invention.

FIG. 5 shows a fifth exemplary embodiment of an amplifier according to an aspect of the present invention. This amplifier corresponds partly with the amplifier from FIG. 2. In this case, the adjustable capacitor 34 has been replaced with a first adjustable capacitor 34a connected to ground 31, an adjustable inductance 35b and a second adjustable capacitor 34b connected to ground 31. These are each adjusted by a dedicated servo motor 33a, 33b and 33c. The servo motors 33a, 33b and 33c are controlled by the control device 32. With this configuration, an even larger bandwidth of the amplifier can be realized. A simple realization can be achieved by selecting the interactivity to be non-adjustable. Complexity can be further reduced by adjusting the two adjustable capacitors 34a and 34b in a synchronous manner.

Instead of switching between different structural elements by means of an electrically controlled switch 36, as illustrated in FIG. 3, the use of a manually activated switch is also possible. It is also possible to switch between structural elements which are illustrated in the other drawings. The following section describes an exemplary embodiment in which a switching is implemented between an ohmic resistor as illustrated in FIG. 3 and an n-element as illustrated in FIG. 5.

Figure 6A:
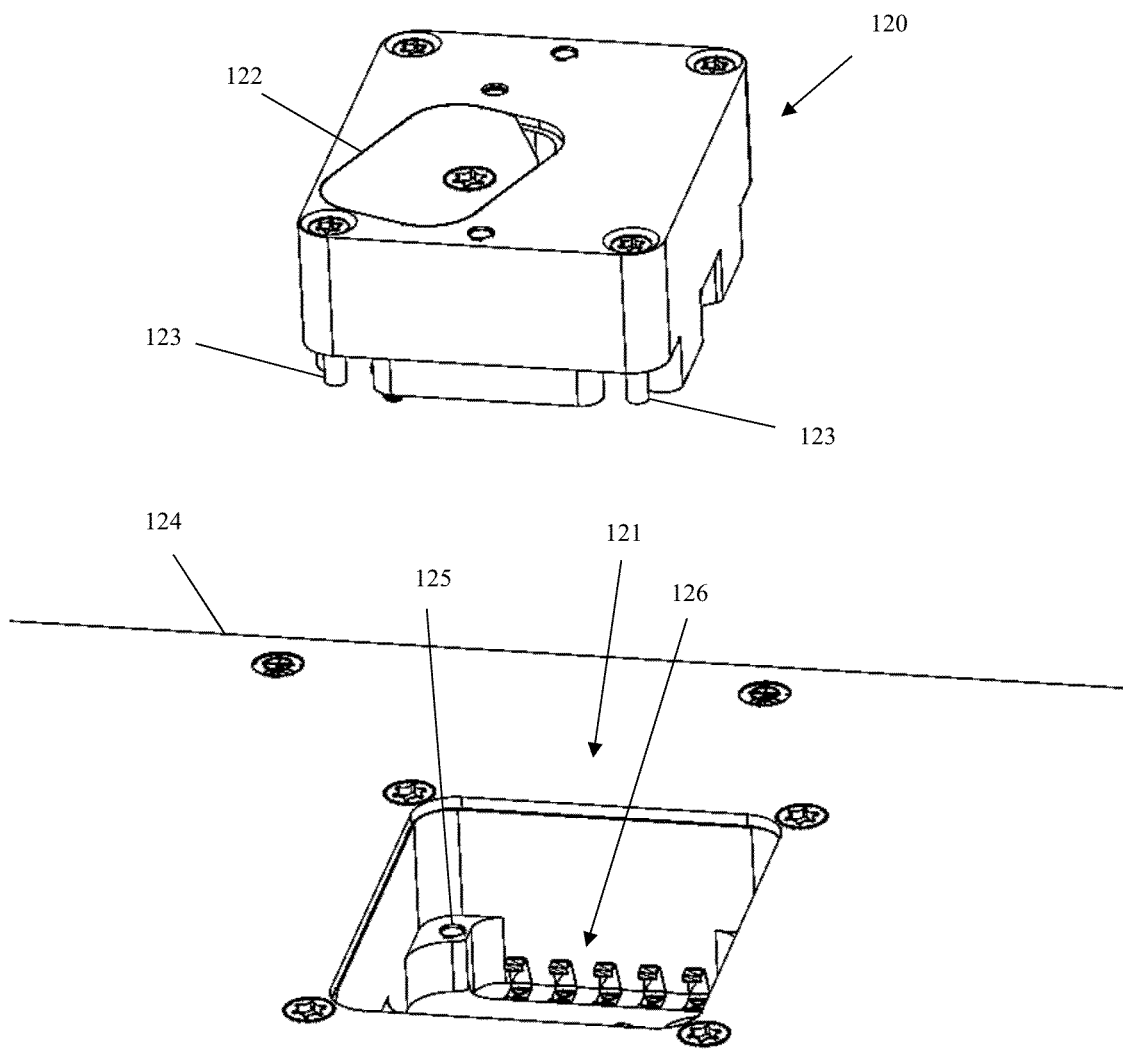
FIG. 6a is a sixth exemplary embodiment of the amplifier according to an aspect of the present invention in a first switching state.
Figure 6B:
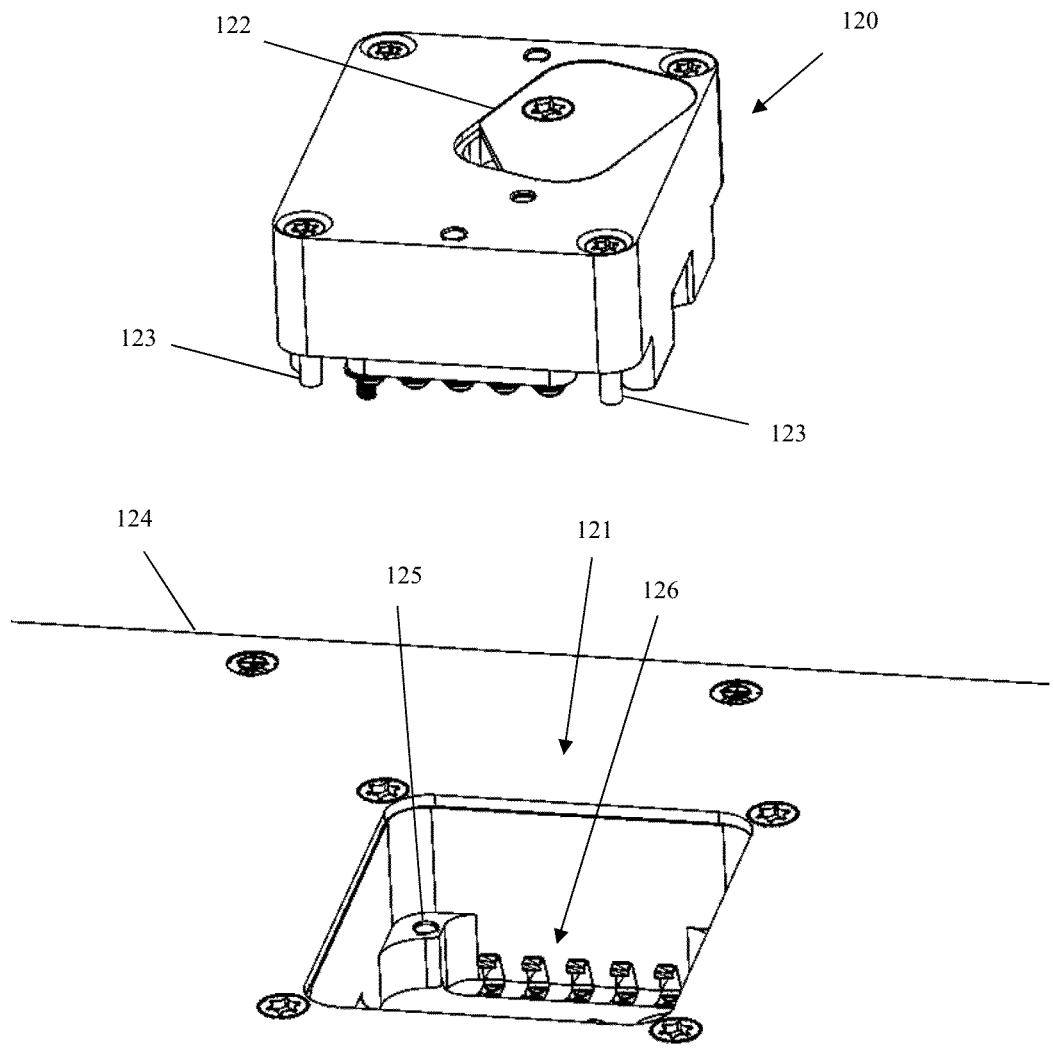
FIG. 6b is the sixth exemplary embodiment of the amplifier according to an aspect of the present invention in a second switching state.

FIG. 6a and FIG. 6b show a sixth exemplary embodiment of an amplifier according to an aspect of the present invention. This amplifier provides an amplifier housing 124 and a plug-in module 120. The amplifier housing 124 contains all of the structural elements of the amplifier with the exception of at least some the structural elements connected to the insulation terminal. The plug-in module 120 contains at least one part of the structural elements to be connected to the insulation terminal. The amplifier housing 124 provides a recess 121 for receiving the plug-in module 120.

The plug-in module 120 comprises guide pins 123 which engage in guides 125 when the plug-in module 120 is inserted into the recess 121 of the amplifier housing 124 and accordingly allow the plug-in module 120 to be positioned in the amplifier housing 124 with high precision.

Spring contacts 126 for contacting the plug-in module 120 are additionally arranged in the recess 121 of the amplifier housing 124. The function of the spring contacts 126 will be described in greater detail with reference to FIG. 7. The plug-in module 120 further provides a removable cover 122. When the cover 122 is removed, tuneable circuit elements can be tuned through this aperture. These elements will also be described in greater detail with reference to FIG. 7.

The plug-in module 120 is accordingly embodied in such a manner that it can be inserted into the recess 121 in different orientations. FIG. 6a shows a first orientation of the plug-in module 120 relative to the recess 121. FIG. 6b shows a second orientation of the plug-in module 120 relative to the recess 121. Inserting the plug-in module 120 into the recess 121 in different orientations establishes a connection between different structural elements in the plug-in module 120 and the remainder of the amplifier within the amplifier housing 124. That is, insertion with different orientations fulfils the function of switching between different connected structural elements. This will also be described in greater detail with reference to FIG. 7.

Figure 7:
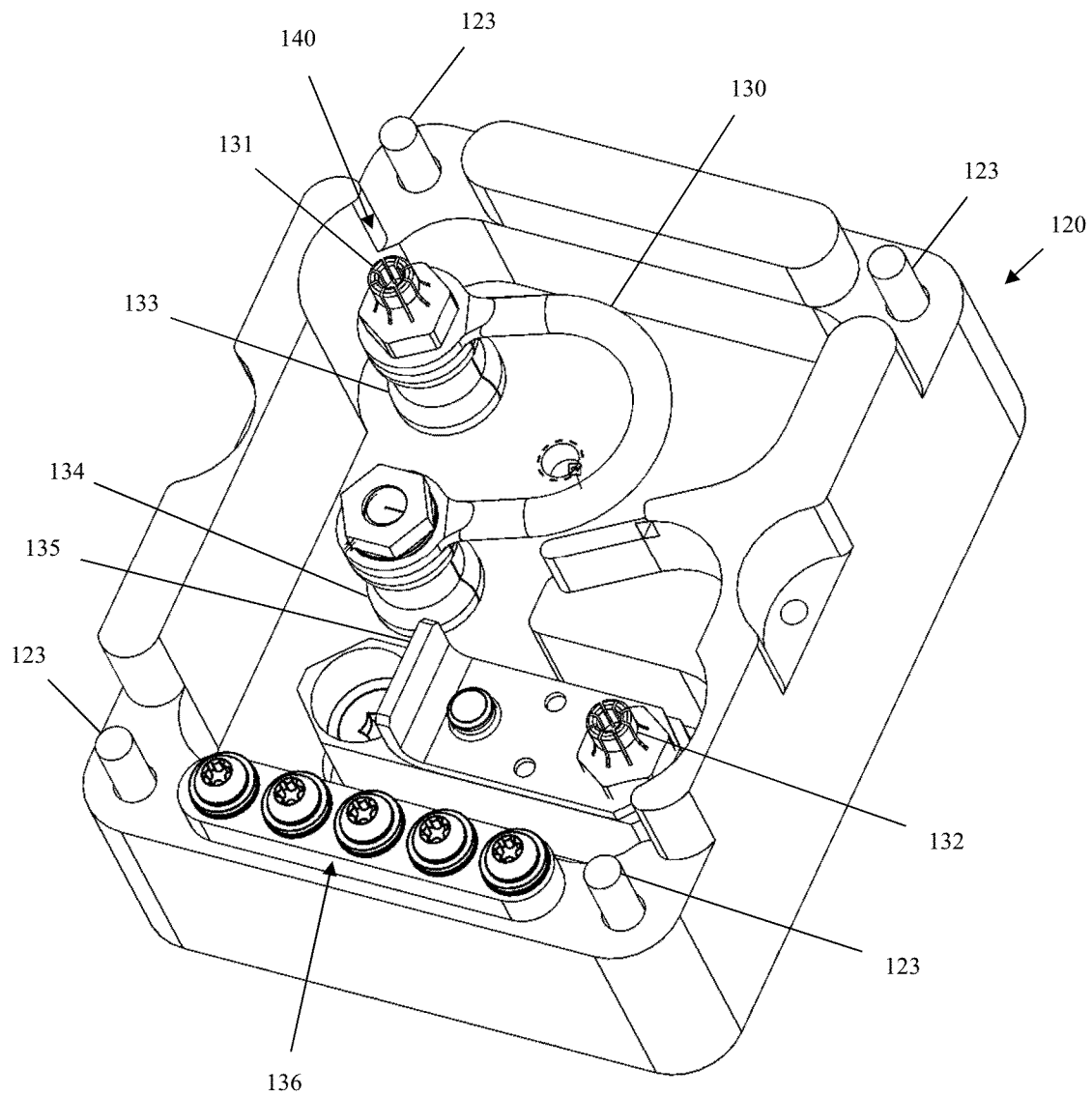
FIG. 7 is a detail view of the sixth exemplary embodiment of the amplifier according to an aspect of the present invention.

FIG. 7 shows a detail view of the sixth exemplary embodiment of the amplifier according to an aspect of the present invention. FIG. 7 shows the side of the plug-in module 120 disposed opposite to the view shown in FIGS. 6a and 6b. Here also, the guide pins 123 are clearly visible. The plug-in module 120 contains a π-element 140, which is formed from two adjustable capacitors 133, 134 and one inductance 130. The capacitors 133, 134 presented here are adjustable cylindrical capacitors. The capacitances of the cylindrical capacitors 133, 134 can be tuned by means of screws through the cover 122 illustrated in FIGS. 6a and 6b, which is arranged on the underside of the plug-in module 120 shown in FIG. 7. The use of other adjustable elements is also conceivable here. Instead of an π-element 140, a single adjustable capacitor or any of the elements shown in FIGS. 1-5 connected to the terminal 12 could be used as alternatives.

A socket contact 131 is additionally connected to a first terminal of the first capacitor 133. The inductance 130 is further connected to this first terminal. In this context, the inductance 130 is formed by a half winding, that is, a 180°-wire-loop. The inductance 130 connects the first terminal of the first capacitor 133 to a first terminal of the second capacitor 134. In each case, the second terminals of the capacitors are connected to the housing, that is, to ground.

Beyond this, the plug-in module 120 contains a second socket contact 132, which is connected to a contact bridge 135. The contact bridge 135 is embodied in such a manner that it establishes a connection with a 50-ohm load arranged in the amplifier housing 124 when the plug-in module 120 is inserted into the recess 121 of the amplifier housing 124 in a first orientation. In this orientation, the port socket 132 establishes direct contact with the output 12 of the amplifier. That is, in this orientation, the contact bridge 135 connects the terminal 12 of the amplifier to a 50-ohm load. With regard to FIG. 3, this corresponds to the lower switch setting of the switch 36. This first orientation of the plug-in module 120 therefore corresponds with the conventional AB operating mode of the amplifier.

However, if the plug-in module 120 is inserted into the recess 121 of the amplifier housing 124 in the second orientation, the contact socket 131 makes contact with the terminal 12. In this manner, the terminal 12 is connected to the π-element 140. This second orientation of the plug-in module 120 therefore corresponds to a connection of a π-element to the terminal 12 of the amplifier, as illustrated in FIG. 5. A connection of this kind corresponds to the Doherty operating mode of the amplifier.

The plug-in module 120 additionally provides several coding screws 136. These are arranged on the plug-in module 120 in such a manner that, when the plug-in module 120 is inserted into the recess 121, they make contact with the spring contacts 126. These spring contacts 126 are arranged only on one of the two opposite sides of the recess 121 so that they can make contact with the coding screws only in the second orientation of the plug-in module 120, that is, when operating the amplifier as a Doherty amplifier.

As a result of the presence of the coding screws, the respective spring contact 126 disposed under them is closed. Accordingly, the spring contacts 126 are connected to a control device in such a manner that the latter recognizes the switching state of every individual spring contact 126. The coding screws 136 can be tightened or loosened individually. They can also be removed individually. Accordingly, the bit pattern, which is formed as a result of the presence or absence of the individual screws or the depth of screwing of the individual screws, codes the tuning frequency of the π-element 140 currently adjusted. That is to say, when setting a frequency range for the Doherty operating mode of the amplifier according to an aspect of the present invention, the adjusted frequency is additionally manually modelled as a bit pattern in the coding screws 136. The amplifier therefore recognizes, via the spring contacts 126, the frequency to which the π-element 140 is adjusted.

Via the 5 illustrated coding screws 136, 32 adjustable channels, that is, 32 channels are conceivable in principle. In practice, for example, 12 channels are operated in this context in the UHF range. With each individual setting, the system operates optimally on 3-4 channels and in an acceptable manner in the respectively adjacent channels. With corresponding tuning, the amplifier can be used in the Doherty mode over the entire frequency range between 470 and 862 MHz. Accordingly, there are seven standard tunings which cover the entire frequency range. The standard tunings can also be optimized beyond this on given channels within their tuning range.

Figure 8:
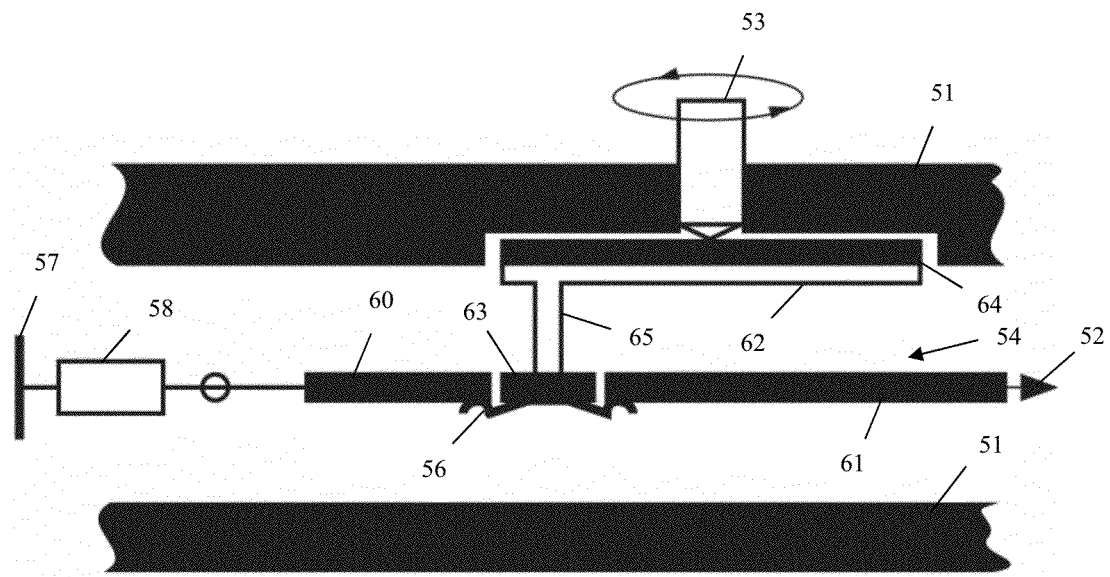
FIG. 8 is a first exemplary embodiment of the capacitor circuit according to an aspect of the present invention in a first state.
Figure 9:
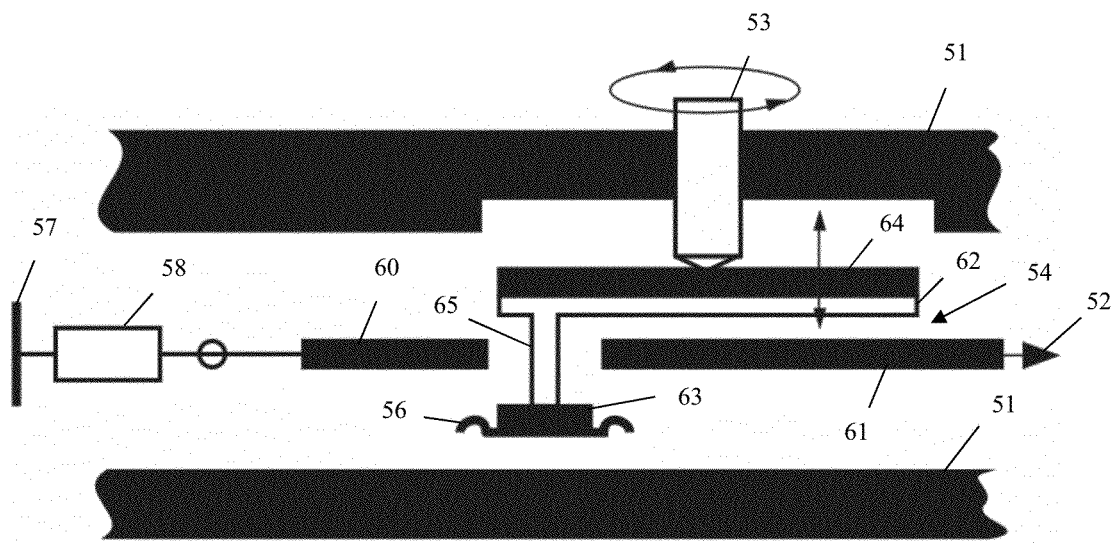
FIG. 9 is the first exemplary embodiment of the capacitor circuit according to an aspect of the present invention in a second state.

FIGS. 8 and 9 show a first exemplary embodiment of a capacitor circuit according to an aspect of the present invention. A first capacitor plate 61 is connected to a terminal 52, which corresponds to the output terminal 12 from FIGS. 1-5. Together with a second capacitor plate 64, this forms a capacitor 54. The second capacitor plate 64 is connected in this context to a motorized spindle 53. The spacing distance between the second capacitor plate 64 and the first capacitor plate 61 is adjusted by means of the motorized spindle 53. The motorized spindle 53 is accordingly driven by a servo motor. As an alternative, the use of a manually driven spindle is also possible.

An insulator plate 62, which provides a carrier 65, is connected to the second capacitor plate 64. In turn, the carrier 65 is connected to a conductor portion 63, which is connected to a switch terminal 56. By means of the switch terminal 56, the first capacitor plate 61 can be connected to a conductor portion 60. The conductor portion 60 is connected, in turn, to a terminating resistor 58 and the ground connection 57. The capacitor 54 here corresponds to the adjustable capacitor 34 from FIGS. 2-3. The switch terminal 56 here corresponds to the switch 36 from FIGS. 2-3. The terminating resistor 58 and the ground connection 57 correspond to the terminating resistor 38 and the ground connection 37 from FIG. 3.

FIG. 8 shows a first state of the capacitor circuit. The motorized spindle 53 has moved the second capacitor plate 64 to a maximum distance from the first capacitor plate 61. The insulator plate 62 and the carrier 65 pull the conductor portion 63, and with it also the switch termination 56, which is realized here as a contact spring, towards the first capacitor plate 61 and the conductor portion 60. The first capacitor plate 61, the switch connection 56, the conductor portion 63 and the conductor portion 60 are therefore electrically connected to one another. The terminal 52 is accordingly electrically connected to the terminating resistor 58 and through this to the ground connection 57. This corresponds to the lower switch position of the switch 36 from FIG. 3.

FIG. 9 shows a second state of the capacitor circuit. The motorized spindle 53 has moved the second capacitor plate 54, and with it also the insulator plate 62, the carrier 65, the conductor portion 63 and the switch terminal 56, downwards. The switch terminal 56 has lost contact with the first capacitor plate 61 and the conductor portion 60. This corresponds to the upper switch position of the switch 36 from FIG. 3. As a result of the distance between the first capacitor plate 61 and the second capacitor plate 64, the capacitance of the capacitor 54 is adjusted. That is to say, it is matched in this manner to the operating frequency of the amplifier within which this capacitor circuit can be used.

Since the insulator plate 62 and the carrier 65 are made from a non-conducting material, they only influence the field characteristic of the capacitor 54 to an insubstantial extent. By manufacturing the insulator plate 62 and the carrier 65 from a material which provides a similar dielectric constant to the surrounding medium, for example, air, the influence can be further reduced.

In the switch position illustrated in FIG. 8, the first capacitor plate 61 acts only as a conductor which connects the terminal 52 to the terminating resistor 58. In this context, the distance from the second capacitor plate 64 is so large that no significant effect occurs. Accordingly, the second capacitor plate 54 is disposed at ground potential via the motorized spindle and the housing 51.

Figure 10:
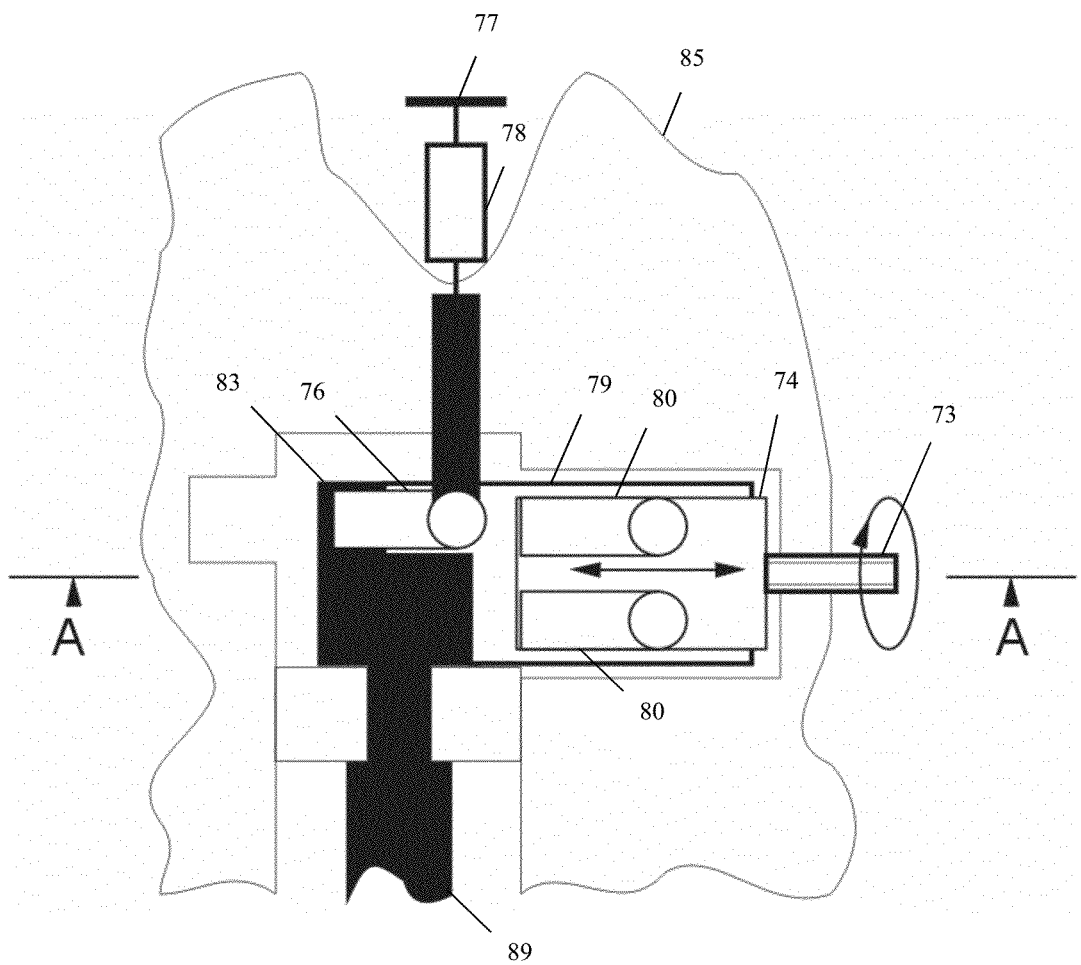
FIG. 10 is a first view of a second exemplary embodiment of the capacitor circuit according to an aspect of the present invention in a first state.
Figure 11:
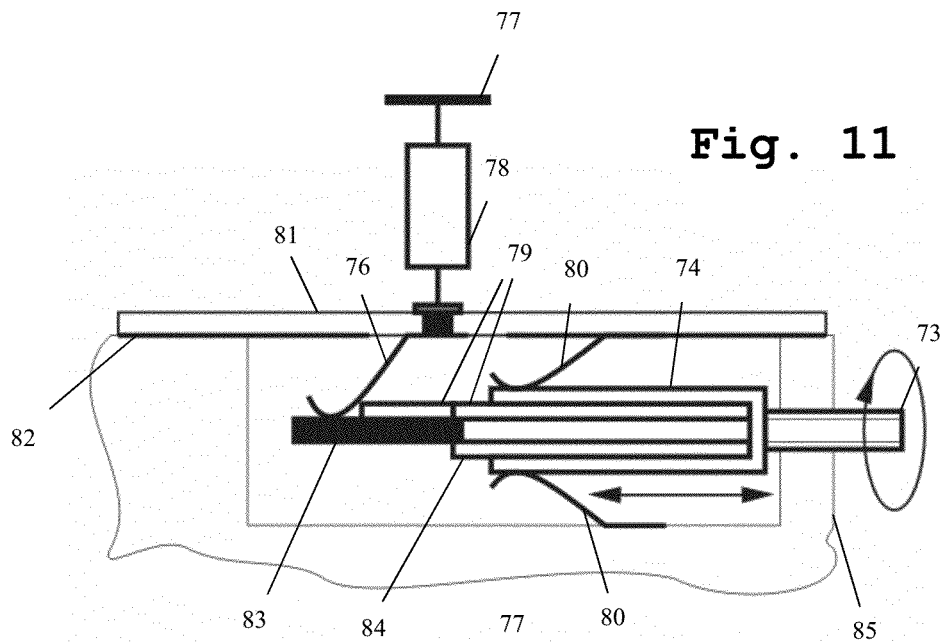
FIG. 11 is a second view of the second exemplary embodiment of the capacitor circuit according to an aspect of the present invention in the first state.
Figure 12:
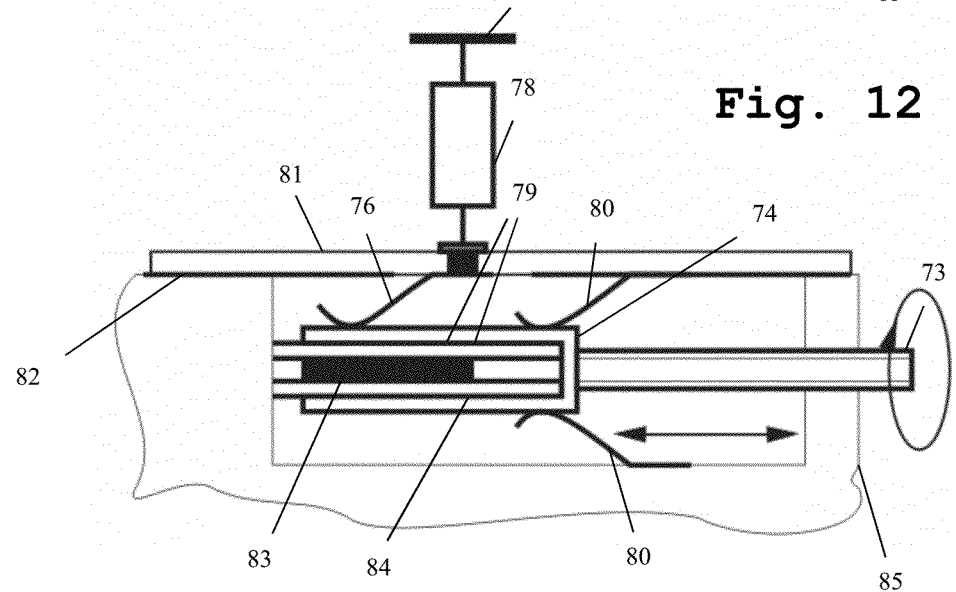
FIG. 12 is the second exemplary embodiment of the capacitor circuit according to an aspect of the present invention in a second state.

FIGS. 10-12 show a second exemplary embodiment of a capacitor circuit according to an aspect of the present invention. The view in FIGS. 11 and 12 corresponds to the section along the sectional line A from FIG. 10. A housing 85 is disposed at ground potential. The housing 85 is covered on one side by a conductor plate 81, which is provided with a metallized ground layer 82 on its underside. A conductor 89 is disposed in the recess of the housing 85. This is realized here as a flat strip conductor. The upper end of the conductor 89 in this context is embodied to form a first capacitor plate 83.

In a first state which is illustrated in FIG. 10 and FIG. 11, the first capacitor plate 83 is connected, via a switch terminal 76, which is realized here as a contact spring, to a terminating resistor 78 and a ground connection 77. This corresponds to the lower switch position from FIG. 3. The conductor 89 is thus connected at its lower end to the insulation terminal of the amplifier, in which the capacitor circuit shown here is inserted.

A motorized spindle 73 which can be driven, for example, by the servo motor 33 from FIG. 3, is connected to a second capacitor plate 74. The second capacitor plate 74 is connected to an insulator plate 79. The insulator plate 79 provides a projection in the region of the switch terminal 76. In this context, the second capacitor plate 74 is embodied in such a manner that it can surround the first capacitor plate. Accordingly, on its upper side, it is separated by the first insulator plate 69 from the first capacitor plate 83. On its underside, it is held at a distance from the first capacitor plate 83 by a second insulator plate 84, which is also connected to the second capacitor plate 74.

In a first state, which is shown in FIG. 10 and FIG. 11, the switch terminal 76 is disposed in contact with the first capacitor plate 83. Accordingly, a conducting connection to the terminal 82 and the terminating resistor 78 is provided. In a second state, which is shown in FIG. 12, the motorized spindle 73 has moved the second capacitor plate 74 and the first and second insulator plate 79, 84 in the direction towards the first capacitor plate 83. The projection of the first insulator plate 79 has lifted the switch terminal 76 from the first capacitor plate 83 and therefore interrupted the electrical connection of the line 89 to the terminating resistor 78. At the same time, the second capacitor plate 74 has been fitted around the first capacitor plate 83. As a result, the capacitance between the first capacitor plate 83 and the second capacitor plate 74 has risen significantly. Accordingly, the second capacitor plate 74 is disposed in electrical contact with contact springs 80, which establish a contact with the housing 85 disposed at ground potential. The required capacitance can be adjusted by means of the motorized spindle 73, via the precise positioning of the second capacitor plate 74. This allows an adjustment of the operating frequency of the amplifier into which the capacitor circuit shown here is to be inserted.

Figure 13:
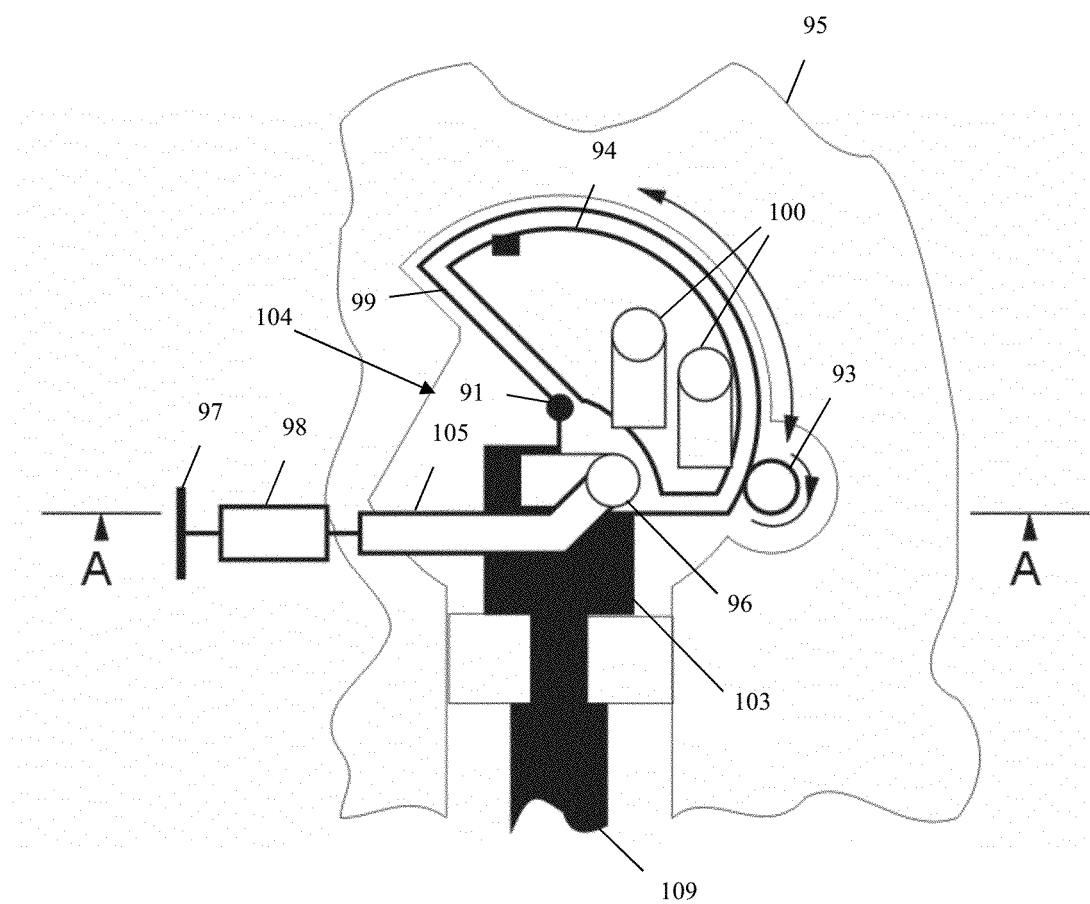
FIG. 13 is a first view of a third exemplary embodiment of the capacitor circuit according to an aspect of the present invention in a first state.
Figure 14:
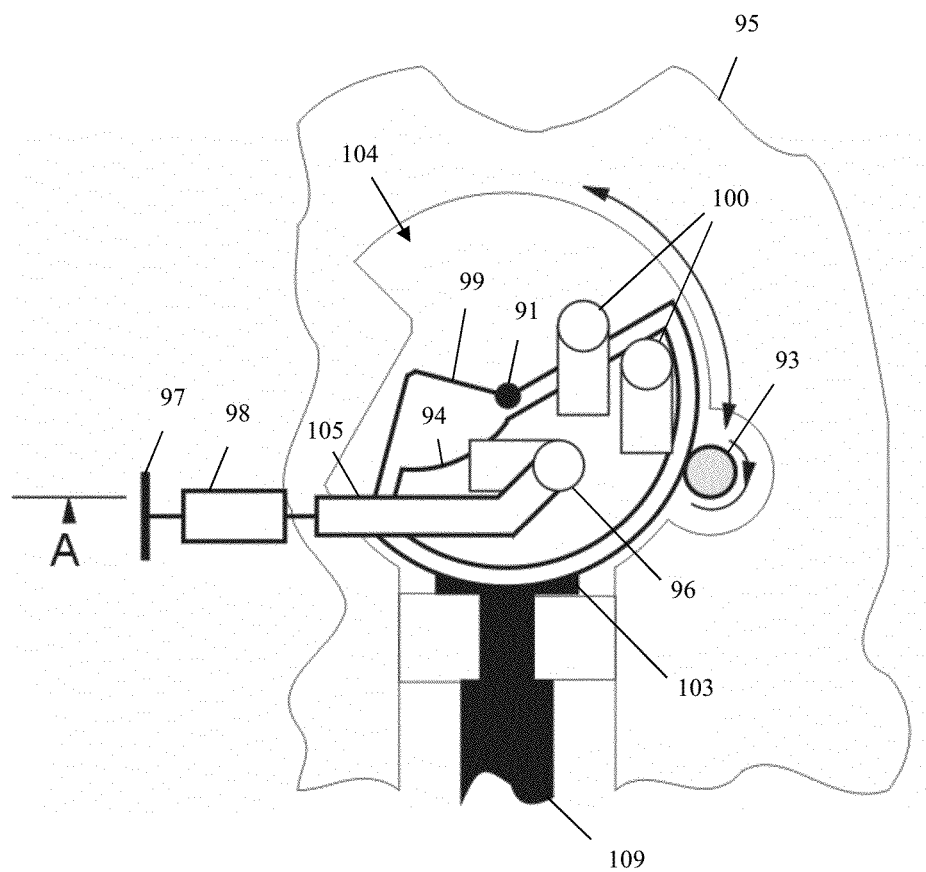
FIG. 14 is the third exemplary embodiment of the capacitor circuit according to an aspect of the present invention in a second state.
Figure 15:
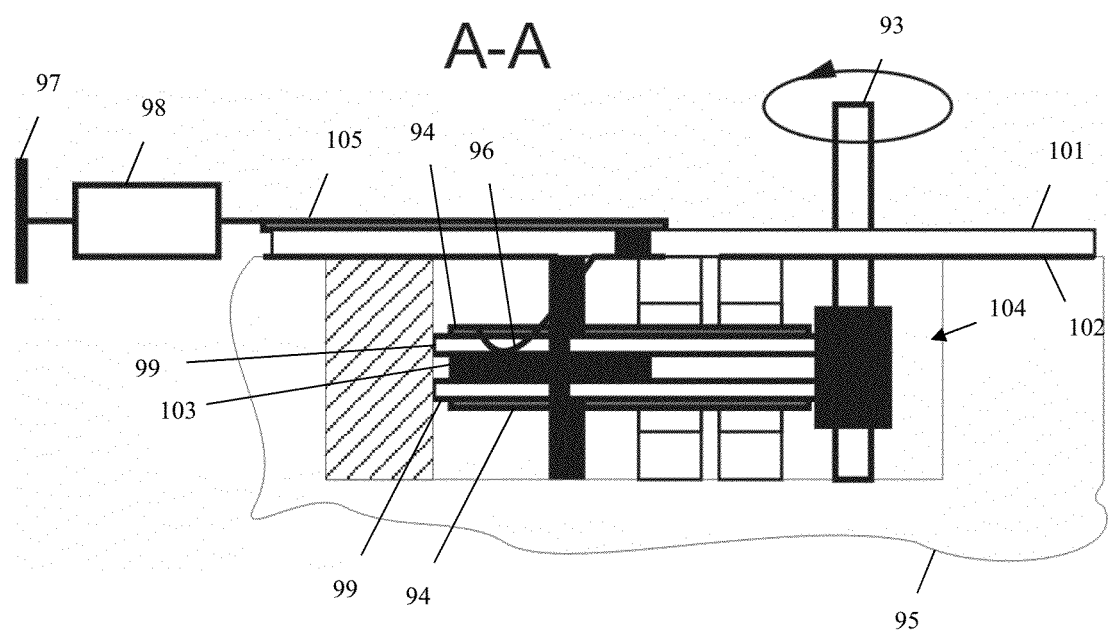
FIG. 15 is a second view of the third exemplary embodiment of the capacitor circuit according to an aspect of the present invention in the first state.

FIGS. 13-15 show a further exemplary embodiment of a capacitor circuit according to an aspect of the present invention. In this context, a rotary capacitor is used to adjust the capacitance. A recess 104 is arranged in a housing 95 disposed at ground potential. The end of a line 109, which is widened to form a first capacitor plate 103, projects into the recess 104. Furthermore, a second capacitor plate 94 which can be rotated about a rotary axle 91 is arranged in the recess 104. Accordingly, the second capacitor plate 94 is embodied in such a manner that it can surround the first capacitor plate 103. The second capacitor plate 94 is therefore connected to an insulator plate 99, which is also designed in such a manner that it can surround the first capacitor plate 103. In this case, the insulator plate 99 is disposed in contact with a motorized spindle 93. By means of a friction wheel or a cogwheel, the motorized spindle 93 engages tangentially on the periphery of the plate and rotates the insulator plate 99 and the second capacitor plate 94 around the rotary axle 91. As an alternative, a direct drive by the rotary axle 91 is possible. In this case, the motorized spindle 93 can be omitted.

A switch terminal 96, which is embodied here as a contact spring, is connected by means of a conductor portion 105 to a terminating resistor 98 and via the latter to a ground connection 97.

In a first state, which is illustrated in FIG. 13 and FIG. 15, the switch terminal 96 establishes a contact between the first capacitor plate and the conductor portion 105. The line 109 is accordingly electrically connected to the terminating resistor 98 and via the latter to the ground connection 97. This corresponds to the lower switch position from FIG. 3.

In a second state, which is shown in FIG. 14, the second capacitor plate 94 and the insulator plate 99 are rotated around the rotary axle 91 in such a manner that the insulator plate 99 and the second capacitor plate 94 interrupt the contact between the switch terminal 96 and the first capacitor plate. The second capacitor plate 94 and the insulator plate 99 now surround the first capacitor plate 103. The second capacitor plate 94 is disposed in electrical contact via contact springs 100 with the housing 95 disposed at ground potential. The state illustrated here corresponds to the upper switch position from FIG. 3. The overlapping of the first capacitor plate 103 and the second capacitor plate 94 can be adjusted via the angle of rotation of the second capacitor plate 94 about the rotary axle 91. In this case, the degree of overlap adjusts the capacitance of the resulting capacitor. The insulator plate 99 thus ensures a constant spacing distance between the first capacitor plate 103 and the second capacitor plate 94. Accordingly, the operating frequency of an amplifier, in which the capacitor circuit shown here is used, is adjusted via the rotary angle.

As already illustrated with reference to FIGS. 11-12, the housing 95 here also provides a cover by means of a conductor plate 101. Here also, the underside of the conductor plate 101 is provided with a metallization 102.

Aspects of the present invention are not restricted to the exemplary embodiments shown. In particular, the capacitor circuits illustrated can also be used in other circuits. A switching or respectively a re-plugging of different structural elements than those illustrated here is also conceivable. All of the features described above or illustrated in the drawings can be advantageously combined with one another within the scope of the present invention, as claimed.

The embodiments of the invention in which an exclusive property or privilege is claimed are defined as follows:

1. A capacitor circuit, comprising:
    a first capacitor plate;
    a second capacitor plate;
    an insulator plate, the second capacitor plate being rigidly connected to the insulator plate, whereas the second capacitor plate and the insulator plate are displaceable relative to the first capacitor plate; and
    a terminal, connected in a detachable manner to the first capacitor plate.

2. The capacitor circuit according to claim 1, wherein the insulator plate and the switch terminal are embodied in such a manner that the insulator plate separates the switch terminal from the first capacitor plate when the first capacitor plate approaches the second capacitor plate.

3. The capacitor circuit according to claim 1, wherein the insulator plate and the switch terminal are embodied in such a manner that the switch terminal comes into contact with the first capacitor plate when the first capacitor plate is moved away from the second capacitor plate.

4. The capacitor circuit according to claim 1, wherein the second capacitor plate and the insulator plate are mounted in a displaceable manner relative to the first capacitor plate by a sliding bearing.

5. The capacitor circuit according to claim 1, wherein the second capacitor plate and the insulator plate are mounted in a rotatable manner relative to the first capacitor plate via a rotary bearing.

6. The capacitor circuit according to claim 1, wherein the switch terminal is a contact spring, and wherein the contact spring is disposed in contact with the first capacitor plate through spring tension.

7. The capacitor circuit according to claim 6, wherein the insulator plate is embodied in such a manner that it is displaced between the contact spring and the first capacitor plate when the first capacitor plate approaches the second capacitor plate.

8. The capacitor circuit according to claim 1, wherein the insulator plate is connected by a carrier to a conductor portion, and wherein the switch terminal connects the conductor portion to the first capacitor plate or respectively separates the conductor portion from the first capacitor plate.

* * * * *